United States Patent [19]

Nishida et al.

[11] 4,396,934
[45] Aug. 2, 1983

[54] CORROSION RESISTANT STRUCTURE FOR CONDUCTOR AND PSG LAYERED SEMICONDUCTOR DEVICE

[75] Inventors: Masanori Nishida, Gunma; Shigeo Ootani, Oota, both of Japan

[73] Assignee: Sanyo Electric Co., Ltd., Moriguchi, Japan

[21] Appl. No.: 229,748

[22] Filed: Jan. 29, 1981

[30] Foreign Application Priority Data

Jan. 31, 1980 [JP] Japan .................................. 55/11075

[51] Int. Cl.³ .................... H01L 29/34; H01L 27/02; H01L 23/48; H01L 23/28
[52] U.S. Cl. ...................................... 357/54; 357/41; 357/49; 357/52; 357/68; 357/72
[58] Field of Search ........................ 357/54, 52, 65, 68, 357/88, 41, 59, 23 VT, 23 TF, 23 C, 49, 72; 427/88, 94

[56] References Cited

U.S. PATENT DOCUMENTS 4,124,863 11/1978 Mason ............................... 357/54 X
4,271,582 6/1981 Shirai et al. ..................... 357/54 X
4,273,805 6/1981 Dawson et al. .................. 357/54 X

FOREIGN PATENT DOCUMENTS 55-11075 1/1980 Japan .

Primary Examiner—Martin H. Edlow
Assistant Examiner—J. Carroll
Attorney, Agent, or Firm—Darby & Darby

[57] ABSTRACT

A semiconductor device comprises an oxide film and a polysilicon electrode formed in succession on a semiconductor substrate, and a phosphor silicate glass layer formed on the polysilicon electrode and the oxide film and having the smoothed surface. An aluminum electrode is formed on the phosphor silicate glass. A nitride film is formed on the aluminum electrode and the phosphor silicate glass layer, for example, by a chemical vapor deposition process, so as to completely cover the phosphor silicate glass layer.

5 Claims, 22 Drawing Figures

CORROSION RESISTANT STRUCTURE FOR CONDUCTOR AND PSG LAYERED SEMICONDUCTOR DEVICE

BACKGROUND OF THE INVENTION

1. Field of the Invention

The present invention relates to a semiconductor device. More specifically, the present invention relates to a film for protecting a semiconductor device formed to prevent disconnection of a conductive layer formed on a phosphorous silicate glass layer in which the phosphorous is highly doped.

2. Description of the Prior Art

One important factor determining reliability of electronic components is the air tightness of the package. In order to attain high degree of air tightness, a hermetic seal such as a metal package, a ceramic package, a glass seal and the like has been used. On the other hand, a resin mold is also often used in consideration of a easier workability and a better cost advantage in spite of the decreased air tightness. Problems involved in a resin mold are that the air tightness of the resin itself is inferior to that of metal, ceramic and the like; the adhesive property of the resin to metal is inferior to that of glass to metal, and many impurities are included in a resin material and the like. As countermeasures therefore, passivation of the surface has been developed with respect to devices, and approaches such as a buffer coat process embedding of a moisture permeable agent in a resin and the like have been employed with respect to a package. In addition, a material of a smaller hygroscopic permeability of moisture and a better adhesive property to metal has been selected with respect to resin.

Generally, the electrical characteristic of a semiconductor device such as a transistor, a large scale integration, or the like is sensitive to atmosphere, such as moisture, detrimental impurities and the like. One major cause of failure is disconnection due to corrosion of an aluminum electrode layer generally used in a semiconductor device. In particular, in sealing a semiconductor device with a resin of epoxy group, it is necessary to take into full consideration protection from moisture in view of the fact that the resin provides poor protection against moisture. Necessity of such protection is well-known to those skilled in the art from many various papers presented in the past. The present invention is directed to an improvement in such protection or in passivation of the surface of a semiconductor device. A conventional method employed in semiconductor publication was to cover with a film of silicon oxide ($SiO_2$) or a film of silicon nitride ($Si_3N_4$) on an aluminum electrode layer formed on a semiconductor device. Silicon oxide ($SiO_2$) and silicon nitride ($Si_3N_4$) films have similar performances with respect to cracks, dirt and the like; however, a film of silicon nitride ($Si_3N_4$) provide better protection with respect to contamination from moisture, as compared with silicon oxide ($SiO_2$). Nevertheless, it was not able to fully prevent an influence of moisture in a semiconductor device with a phosphor silicate glass layer even by using these approaches.

The inventors of the present invention investigated the cause of the above described problems and as a result observed the facts set forth in the following. Now such cause will be described in detail with reference to one example of a conventional semiconductor device shown in FIG. 1.

Figure 1:
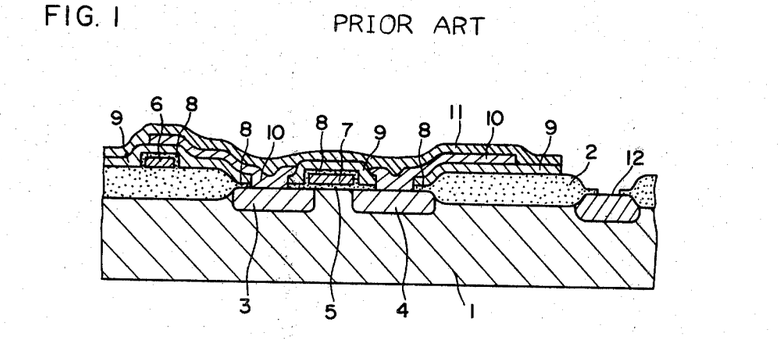
FIG. 1 is a partial sectional view of a conventional N channel silicon gate MOS integrated circuit with a phosphorous silicate glass layer.

FIG. 1 is a sectional view of a portion of a conventional N channel silicon gate MOS integrated circuit using a phosphorous silicate glass layer. A semiconductor device 1 comprises a silicon substrate having P type conductivity, upon which a thermally grown thick oxide film or a field oxide film 2 is formed by a well-known LOCOS (Local Oxidation of Silicon) method, a thermally grown thin oxide film 5 is formed on the portion where a drain regin 3 and a source region 4 are to be formed, and a thermally grown gate oxide film is formed on the portion where a gate portion is to be formed, whereupon a first electrode including an electrode layer 6 and a gate electrode 7 is formed by polycrystalline silicon on the silicon oxide films 2 and 5, respectively. A diffused layer, i.e., the drain region 3 and the source region 4 are formed by duffusing an N type impurity such as phosphorous and at the same time a thin film 8 of silicon dioxide is formed on the surface of the gate electrode 7, the electrode layer 6, the drain region 3 and the source region 4. A phosphorous silicate glass layer 9 is formed on the silicon oxide films 2 and 8. The thin silicon oxide film 8 and the phosphor silicate glass layer 9 on the part of the drain region 3 and the source region 4 are removed by an etching process and, then a second electrode, i.e., an aluminum electrode 10 for connecting elements is formed on the phosphor silicate glass 9 so as to be in ohmic contact with the drain region 3 and the source region 4. The phosphor silicate glass 9 is formed for the purpose of preventing instability due to mobile ions such as alkali ions and for the purpose of preventing disconnection of the aluminum electrode 10. A silicon nitride film 11 is formed on the phosphor silicate glass 9 and aluminum electrode 10 for the purpose of protection, because the phosphor silicate glass 9 has a hygroscopic property.

On the other hand, although a thick oxide film is not formed by the LOCOS method on the scribing line 12 for dividing the semiconductor substrate 1 of a wafer form into chips, the phosphor silicate glass layer 9 and the silicon nitride film 11 are formed after the step of removing the oxide film formed on the occasion of formation of the drain and source regions 3 and 4. However, the above described phosphor silicate glass layer 9 and the silicon nitride film 11 are removed by an etching process using the same mask before the scribing process. Accordingly, the surface of the phosphorous silicate glass layer 9 is covered and protected with the silicon nitride film 11 but the end surface of the phosphorous silicate glass layer 9 is exposed at the end thereof, which allows moisture to be absorbed from the end thereof and accordingly allows the internal aluminum electrode 10 to be corroded.

Figure 2:
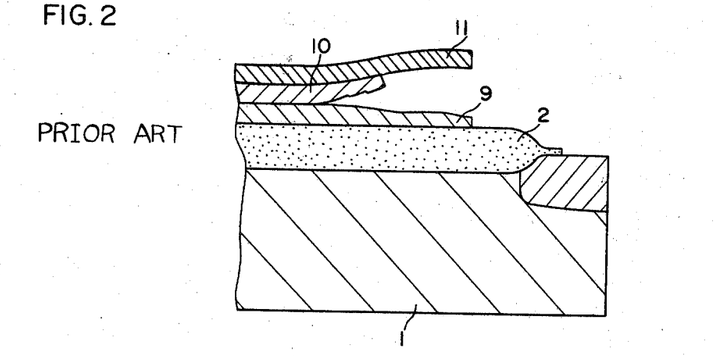
FIG. 2 is a sectional view showing the end portion of the semiconductor device shown in FIG. 1.

FIG. 2 is a sectional view showing the end portion of the semiconductor device of the above described structure. The phosphorous silicate glass 9 formed on the silicon oxide film 2 absorbs moisture from the exposed portion at the end to be softened and the aluminum electrode 10 comes to be corroded when the moisture reaches the aluminum electrode 10, whereby the silicon nitride film 11 and the aluminum electrode 10 comes to be peeled off from the semiconductor substrate 1, with the result that the semiconductor device becomes inoperable eventually.

SUMMARY OF THE INVENTION

Briefly described, the present invention comprises a semiconductor device having a nitride film completely covering a phosphorous silicate glass layer. According to the present invention, the property of the phosphorous silicate glass, i.e. prevention of an influence by alkali ions and prevention of electrode layer disconnection are fully achieved, while the problem of the phosphorous silicate glass, i.e. corrosion of the electrode layer due to the hygroscopic property is fully prevented. As a result, reliability of a semiconductor device can be drastically enhanced.

In a preferred embodiment of the present invention, the end portion of a phosphor silicate glass is determined by a mask for contact formation and the end portion of a nitride film is determined by a mask for formation of a bonding pad portion. At that time, the end of the nitride film is selected to be positioned outside of the end portion of the phosphor silicate glass. According to the preferred embodiment, a so-called self-alignment structure can be employed and therefore the phosphorous silicate glass can be completely covered with a nitride protecting film for stabilization.

Accordingly, a principal object of the present invention is to provide a semiconductor device having an improved protecting film structure.

Another object of the present invention is to provide a semiconductor device including a phosphorous silicate glass layer having phosphorous highly doped, wherein the phosphorous silicate glass is completely covered with a nitride film, whereby the disadvantages of the prior art are fully eliminated.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3A:
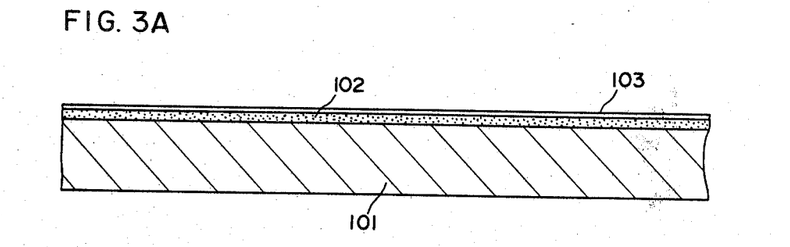
FIGS. 3A to 3S are sectional views showing a partial section of an N channel silicon gate MOS integrated circuit at various different fabrication steps in accordance with the present invention.
Figure 3B:
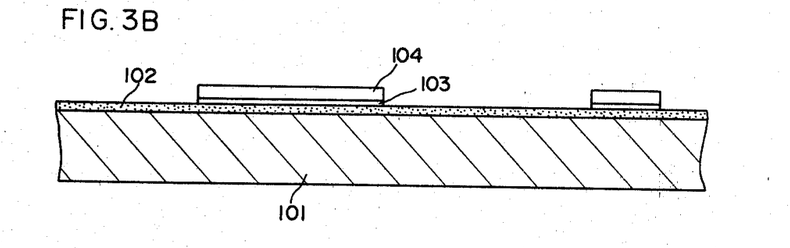
Figure 3C:
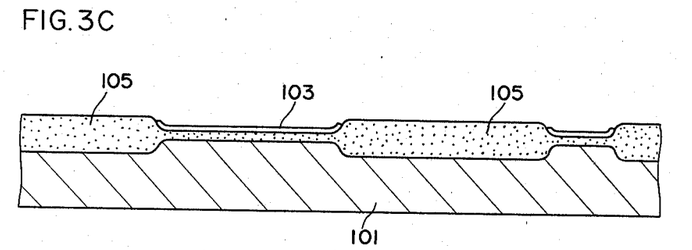
Figure 3D:
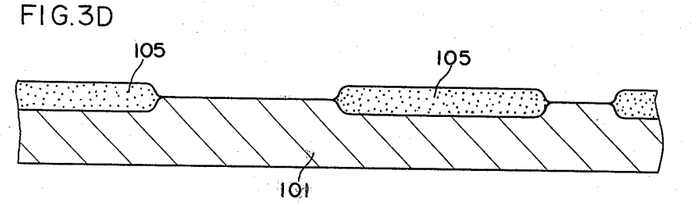
Figure 3E:
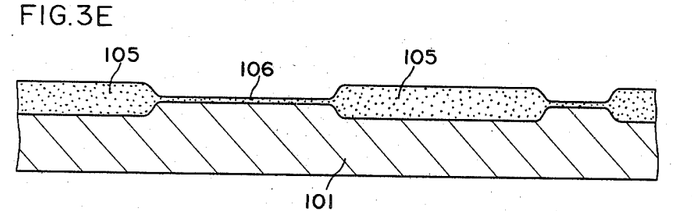
Figure 3F:
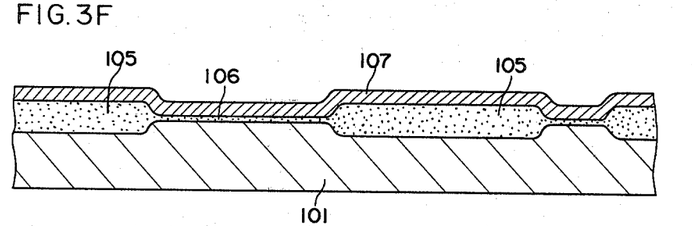
Figure 3G:
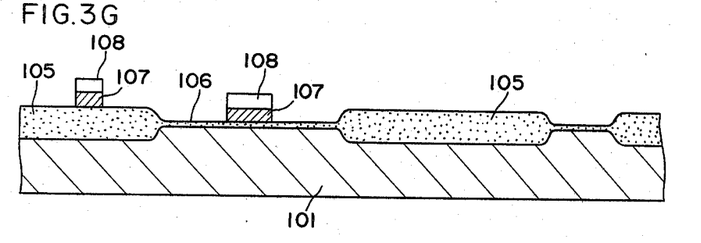
Figure 3H:
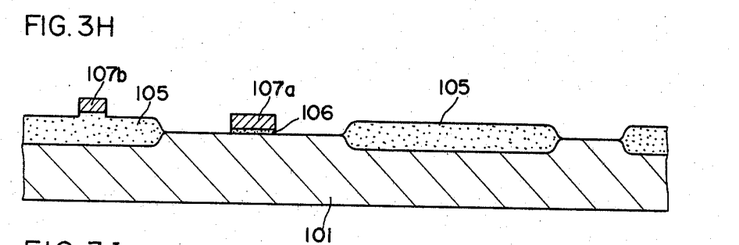
Figure 3I:
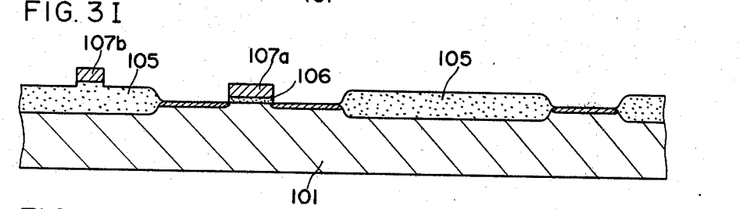
Figure 3J:
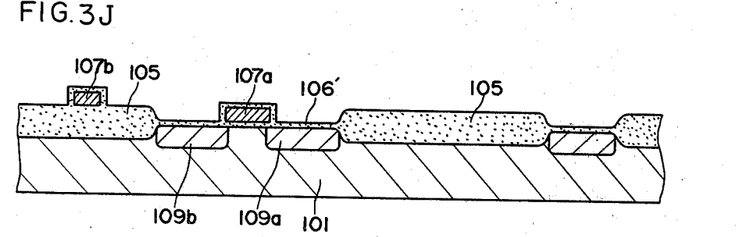
Figure 3K:
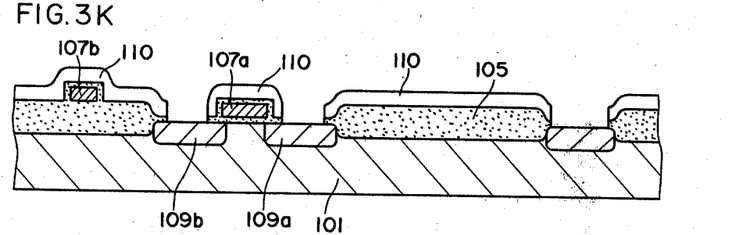
Figure 3L:
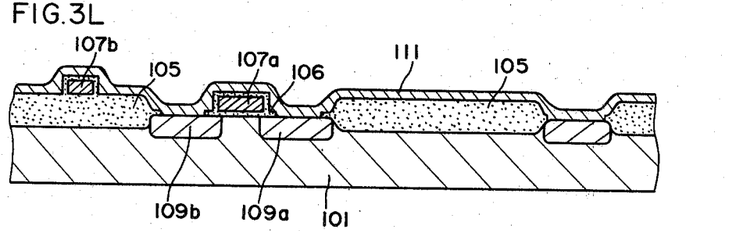
Figure 3M:
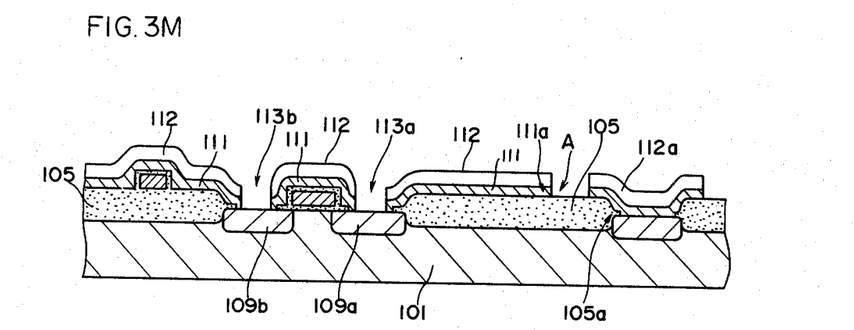
Figure 3N:
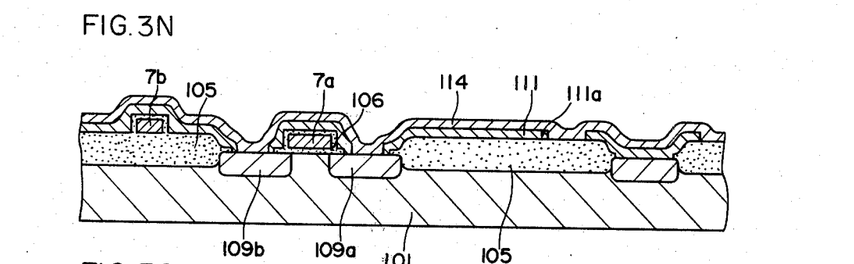
Figure 3O:
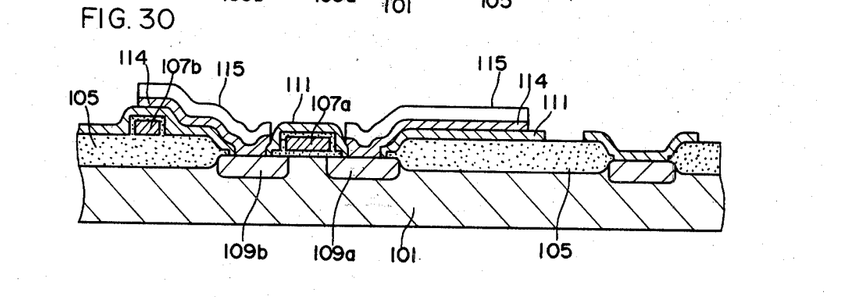
Figure 3P:
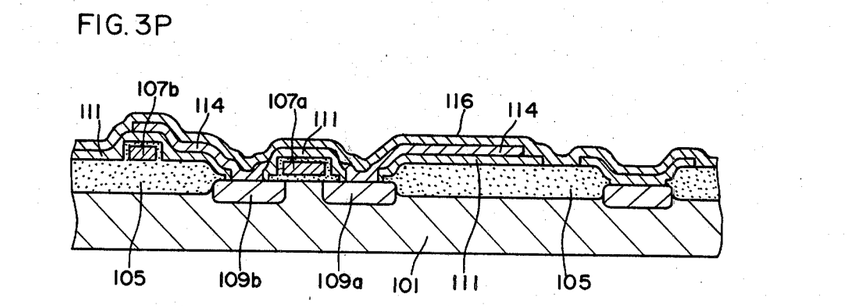
Figure 3Q:
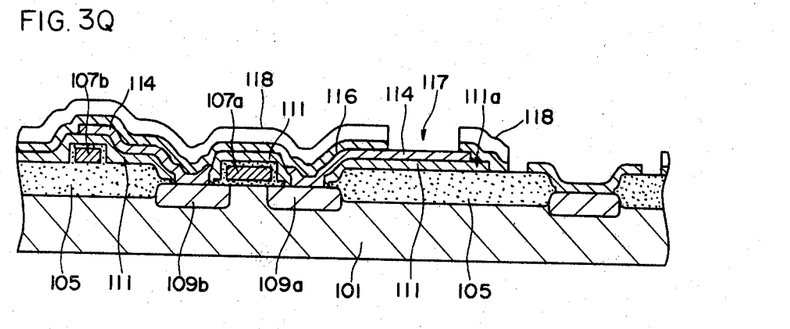
Figure 3R:
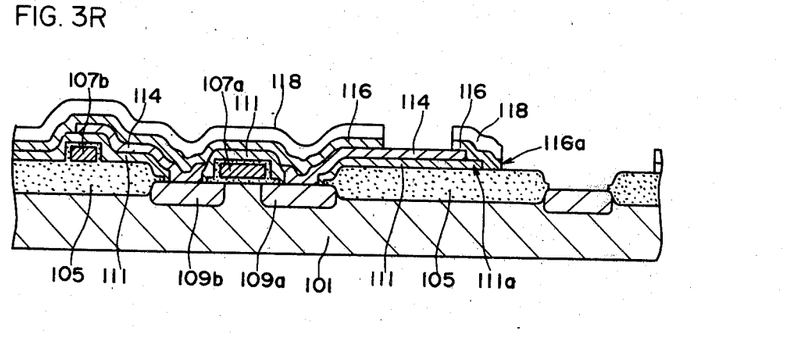
Figure 3S:
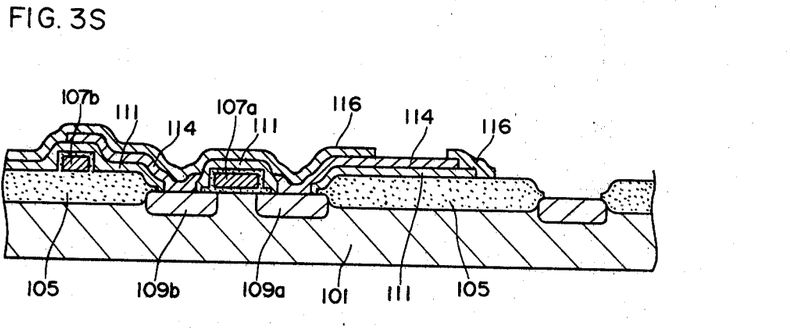

FIGS. 3A to 3S show sectional views of an N channel silicon gate MOS integrated circuit at each step in fabrication as one example of the present invention.

Referring to FIG. 3A, an initial silicon oxide ($SiO_2$) film 102 of about 650 Å is thermally grown on the P type silicon substrate 101 at about 950° C. Then a silicon nitride ($Si_3N_4$) film 103 of about 500 Å is deposited on the initial film 102 in a reactive gas of ($SiH_2Cl_2 + NH_3$) at the temperature of about 750° C. by a chemical vapor deposition process. The $Si_3N_4$ film 103 is used as a mask against oxidizable species as described subsequently. The initial $SiO_2$ film 102 serves to protect the surface of the silicon substrate 101 in the case of plasma etching the $Si_3N_4$ film 103, for example, to be described subsequently with reference to FIG. 3B.

Now referring to FIG. 3B, a photoresist 104 is formed on the $Si_3N_4$ film 103 and at the portion where MOS elements are to be formed and where a scribing line is to be set. Then the $Si_3N_4$ film 103 is removed by a plasma etching process, for example, using the photoresist 104 as a mask. At that time the surface of the silicon substrate 101 is protected by the film 102. Thereafter, for the purpose of controlling the break-down voltage of the device as in the case of a general device, ion implantation of boron is made on the field region using the photoresist 104 as a mask.

Referring to FIG. 3C, the photoresist 104 is removed and then a thick oxide film of about 1.5 μm, in thickness, i.e. a field oxide film 105 is formed by a thermal oxidation process at about 950° C., using the $Si_3N_4$ film 103 as a mask.

Referring to FIG. 3D, first the $Si_3N_4$ film 103 is removed. The initial $SiO_2$ film 102 formed at the previous step shown in FIG. 3A is fully removed and the surface of the silicon substrate 101 is exposed at an MOS region and a scribing line region.

Referring to FIG. 3E, a thin oxide film of about 1000 Å, for example, in thickness, i.e. a gate oxide film 106, is formed on the whole surface by a thermal oxidation process at about 1100° C. The above described formation process of the gate oxide film 106 naturally increases the thickness of the field oxide film 105 formed previously as described in conjunction with FIG. 3C. Meanwhile, as in the case of a general conventional device, after the gate oxide film 106 is formed, boron or phosphorous is ion implanted using a photoresist as a mask for the purpose of controlling a threshold voltage.

Referring to FIG. 3F, a polysilicon layer 107 is deposited on the whole surface of the oxide films 105 and 106 through thermal decomposition of silane ($SiH_4$) at about 640° C. by a chemical vapor deposition process. The polysilicon layer 107 is used as a gate electrode and an interconnection, i.e. a first electrode, to be described subsequently.

Referring to FIG. 3G, a photoresist 108 is formed only at the portion where the gate electrode and the interconnection are to be formed and the unnecessary portion of the polysilicon layer 107 is removed by a plasma etching process, for example, using the photoresist 108 as a mask.

Referring to FIG. 3H, after the gate electrode 107a and the interconnection 107b are first formed, the photoresist 108 (FIG. 3G) which became unnecessary is removed. Then using the polysilicon 107a as a mask, the gate oxide film 106 (FIG. 3G) on the source and drain regions, the oxide films 105 and the oxide film on the scribing line are removed by an etching process, whereby the surface of the substrate 101 is exposed at the portion of the source, drain and the scribing line regions.

Referring to FIG. 3I, phosphorous serving as an impurity of $N^+$ is deposited on the source and drain regions and the polysilicon layers 107a and 107b by heat treatment of $POCl_3$ at approximately 1000° C. At the same time, phosphorous is also deposited on the scribing line. Meanwhile, although a phosphorous silicate glass layer is formed on the oxide film 105, the silicon substrate 101, and polysilicon layers 107a and 107b, the same is all removed after completion of the depositing process.

Referring to FIG. 3J, the impurity deposited at the previous step described in conjunction with FIG. 3I, i.e. phosphorous is heat treated at 950° C., for the purpose of thermal diffusion, whereby diffusion layers 109a and 109b serving as the source and drain regions are formed. At the same time, a thermal oxide film of 1000 Å in thickness is formed for the purpose of reparing the gate oxide film 106a as undercut at the previous thermal oxidation process described in conjunction with FIG. 3I.

Referring to FIG. 3K, the thermal oxide film on the diffusion layers 109a and 109b is removed by an etching process using the photoresist 110 as a mask. Meanwhile, at that time the oxide film on the scribing line is also simultaneously removed. The purpose of removing the oxide film on the scribing line is to make it easy for a diamond cutter to cut the substrate on the occasion of diamond scribing, for example. Assuming that the oxide film on the scribing line is to be removed by an etching process after all the steps are completed, then an inconvenience would be caused to other films due to a difference in the etching rates of the respective films. Therefore, it is necessary to remove the oxide film on the scribing line at each step of formation of necessary oxide films.

Referring to FIG. 3L, the photoresist 110 used for removing the oxide film at the step shown in FIG. 3K is first removed. Then a phosphorous doped $SiO_2$ layer, i.e. a phosphor silicate glass layer 111 is formed to the thickness of 5000 Å, by a chemical vapor deposition process using a mixture gas of ($PH_3+SiH_4+O_2$). The phosphor silicate glass 111 is formed to cover the whole surface. Then the surface of the phosphor silicate glass 111 is smoothed or made even by a high temperature treatment at 1000° C. As a result, disconnection of an aluminum electrode (to be described subsequently) (for example, connected to the gate electrode 107a and the interconnection 107b) is effectively prevented. Such high temperature treatment is well-known to those skilled in the art as a reflow process. The phosphorous silicate glass layer 111 serves to trap externally existing, such as $Na^+$ ions, thereby to make them inactive electrically, and as a result functions to effectively prevent an influence of such alkali ions.

Referring to FIG. 3M, a photoresist 112 is formed on the phosphorous doped $SiO_2$ layer or the phosphorous silicate glass layer 111 and the phosphor silicate glass on the diffusion layers 109a and 109b and the phosphorous silicate glass at the portion A which is to become the end portion are removed by an etching process using the photoresist 112 as a mask. At that time, by making an etching process using the photoresist 112a as a mask, the portion A is formed such that the end portion 111a of the phosphorous silicate glass may be inside of the end portion 105a of the field oxide film 105 removed by the etching process described in conjunction with FIG. 3K. Thus, the end portion 111a of the phosphor silicate glass is determined by the photoresists 112 and 112a. Meanwhile, referring to FIG. 3M, the phosphorous silicate glass on the scribing line is not removed for the following reasons. If and when a nitride film to be described subsequently is formed directly on the surface of the substrate 101 on the scribing line, then the surface becomes hard and it becomes difficult for a diamond cutter to cut the substrate on the occasion of diamond scribing. If the phosphorous silicate glass which is easily removed by an etching process, is left, the substrate surface on the scribing line can be effectively prevented from being hardened. On the other hand, on the occasion of laser scribing, a film on the scribing line may be removed at each step, as described previously.

Referring to FIG. 3N, the photoresists 112 and 112a utilized previously in conjunction with FIG. 3M are removed and then an aluminum layer 114 serving as an electrode for connection of elements is evaporated to become 1.3 μm, for example, in thickness. Therefore, the aluminum layer 114 is connected to the diffusion layers, i.e. the source region and the drain region 109a and 109b, respectively, through the windows 113a and 113b, respectively, (FIG. 3M) in an ohmic contact manner. Meanwhile, as described previously, since the surface of the phosphorous silicate glass has been smoothed the second electrode, i.e. the aluminum electrode 114 formed on the phosphorous silicate glass 111 is difficult to be disconnected.

Referring to FIG. 3O, the aluminum layer 114 is selectively etched using the photoresist 115 as a mask, whereby the electrode and interconnection of the second electrode pattern is formed.

Referring to FIG. 3P, the photoresist 115 used in FIG. 3O is removed and then a film 116 of $Si_3N_4$ for the purpose of protecting the surface is formed on the whole surface of the substrate. The nitride film 116 is formed to a thickness of 1.0 μm, by a chemical vapor deposition process using a mixture gas of ($SiH_4+NH_3$).

Referring to FIG. 3O, for the purpose of forming a pad portion 117, the nitride film on the aluminum electrode to be the pad portion 117 and on the scribing line is removed using the photoresist 118 as a mask. At that time, the pad portion 117 is formed to be smaller than the pad size of the aluminum electrode 114, thereby to insure that the end portion of the phosphorous silicate glass 111 may not be exposed from the end portion of the nitride film 116. The end portion 116a of the $Si_3N_4$ layer 116 extends outward from the end portion 111a of the phosphorous silicate glass 111 formed at the step described previously in conjunction with FIG. 3M. By thus setting a positional relation of the end portion 111a of the phosphor silicate glass and the end portion 111a of the nitride film, the end portion 111a of the phosphorous silicate glass is assuredly prevented from exposing outward.

Referring to FIG. 3R, the phosphorous silicate glass 111 (FIG. 3Q) on the scribing line is removed by an etching process using the photoresist 118 as a mask. At that time, since the end portion 116a of the $Si_3N_4$ film 116 extends from the end portion 111a of the phosphor silicate glass 111 close onto the scribing line and to the vicinity of the end portion 105a of the field oxide film 105, and the films 114 and 105 are in close contact with each other, the end portion of the phosphorous silicate glass 111 is completely isolated from outside. Since such film 105 is a thermal oxide film as described in the foregoing, such film 105 has a dense and stabilized structure and accordingly is not corroded by moisture. Therefore, even if the phosphorous silicate glass 111 is of a strong hygroscopic property, the end portion 111a thereof is completely covered with the stabilized films 114 and 105 and therefore moisture is prevented from entering through such films to inside the phosphorous silicate glass 111. Therefore, as compared with a conventional one, the present invention drastically enhances the anti-hummidity property of a semiconductor device.

Referring to FIG. 3S, the photoresist 118 (FIG. 3R) is removed and a wafer of a semiconductor device is completed.

Figure 4:
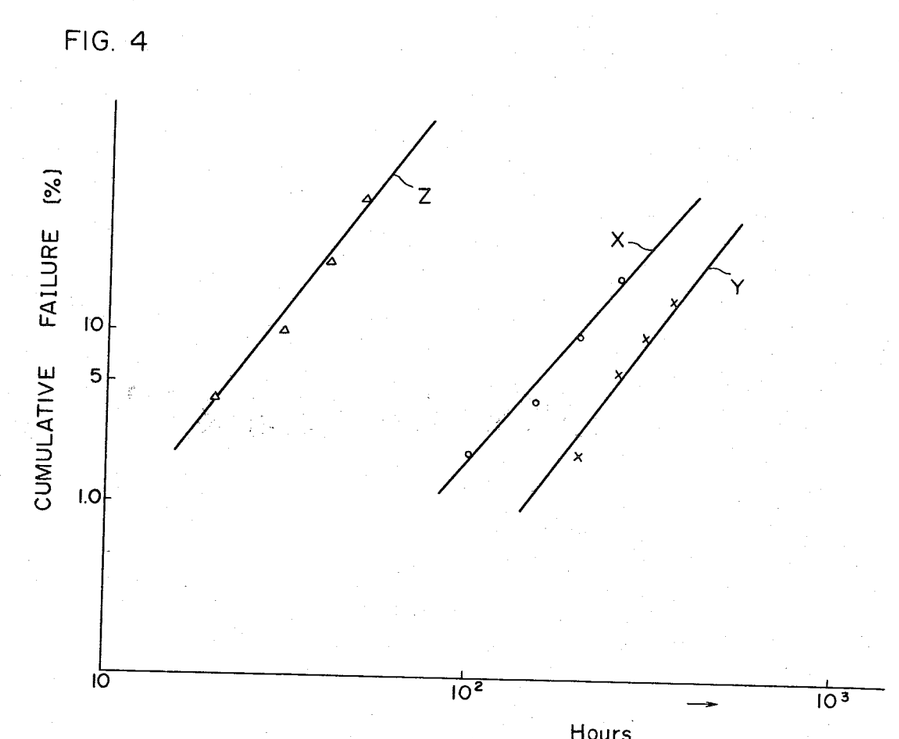
FIG. 4 is a graph for explaining the effect of the present invention, wherein the abscissa indicates time and the ordinate indicates cumulative failure.

FIG. 4 is a graph for describing the effect of the present invention and showing cumulative failure by a pressure/cooker test. Referring to the FIG. 4, the curve X shows the result of the semiconductor devices manufactured in accordance with such a conventional example as shown in FIG. 1 and the curve Y shows the result of the semiconductor devices manufactured in accordance with the present invention. Meanwhile, the curve Z shows only for reference the result of semiconductor devices wherein an $SiO_2$ film is used as a protecting film. As seen from FIG. 4, the inventive semiconductor device even employing the same nitride film as a protecting film has a drastically improved anti-hummidity property, as compared with a conventional one.

Meanwhile, although in the above described embodiment a polysilicon 107 was employed as the first electrode, any other materials such as a molybdenum, silicide (such as tungsten silicide, molybdenum silicide or the like) can be utilized as a material for the first electrode. Furthermore, silicide may be formed by simultaneously evaporating silicon and metal tungsten or molybdenum. Furthermore, as regards the second electrode, i.e. the connection electrode for elements, molybdenum or the like may be used, apart from aluminum used in the above described embodiment. However, in consideration of facility of work in the subsequent bonding step, aluminum is more preferred as a material for the second electrode. It is pointed out that the types of the apparatus, kinds, the thicknesses of the films and the like in the foregoing description are only by way of example and not by way of limitation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of one conductivity type,
    an oxide film formed on one main surface of said semiconductor substrate,
    drain and source regions of the conductivity type opposite to that of said semiconductor substrate formed in said semiconductor substrate adjoining said main surface,
    a first electrode formed on said oxide film and serving as a gate electrode,
    a phosphorous silicate glass layer formed on said first electrode and said oxide film and having a surface smoothed,
    a second electrode formed on said phosphorous silicate glass serving as contacts of said drain and source regions, and
    a nitride film formed on said phosphorous silicate glass layer, said second electrode and said oxide film,
    a scribing line being formed on said semiconductor substrate to encompass said semiconductor device,
    said oxide film extending to the vicinity of said scribing line,
    the end portion of said phosphorous silicate glass layer formed on said oxide film extending to the vicinity of said scribing line being positioned inside the end portion of said oxide film and the end portion of said nitride film being positioned on said oxide film between the end portion of said phosphorous silicate glass layer and said scribing line, said phosphorous silicate glass layer being completely covered through close contact of said nitride film with said oxide film.

2. A semiconductor device in accordance with claim 1, wherein
    said second electrode comprises a bonding pad portion
    and an end portion, said bonding pad portion having said nitride film removed therefrom, whereby said electrode end portion and said phosphorous silicate glass end portion are covered completely by said nitride layer.

3. A semiconductor device in accordance with claim 1, wherein a plurality of MOS elements are provided each including said drain and source regions and said first and second electrodes,
    said first and second electrodes being disposed to interconnect said MOS elements.

4. A semiconductor device in accordance with claim 1, wherein
    said first electrode is made of a member selected from the group consisting of polysilicon, molybdenum silicide and tungsten silicide.

5. A semiconductor device in accordance with claim 1, wherein
    said second electrode is made of a member selected from the group consisting of aluminum and molybdenum.

* * * * *